US012787188B2

(12) United States Patent
Ou

(10) Patent No.: US 12,787,188 B2
(45) Date of Patent: Nov. 3, 2026

(54) FOLDING PORTABLE DISPLAY DEVICE

(71) Applicant: Google LLC, Mountain View, CA (US)

(72) Inventor: Tsung-Yuan Ou, New Taipei City (TW)

(73) Assignee: Google LLC, Mountain View, CA (US)

( * ) Notice: Subject to any disclaimer, the term of this patent is extended or adjusted under 35 U.S.C. 154(b) by 196 days.

(21) Appl. No.: 18/555,819

(22) PCT Filed: Oct. 7, 2022

(86) PCT No.: PCT/US2022/077777
§ 371 (c)(1),
(2) Date: Oct. 17, 2023

(87) PCT Pub. No.: WO2024/076372
PCT Pub. Date: Apr. 11, 2024

(65) Prior Publication Data
US 2025/0081369 A1 Mar. 6, 2025

(51) Int. Cl.
*H05K 5/02* (2006.01)
*E05D 3/12* (2006.01)
*E05D 3/18* (2006.01)
*G06F 1/16* (2006.01)

(52) U.S. Cl.
CPC ......... *H05K 5/0226* (2013.01); *G06F 1/1681* (2013.01); *E05D 3/122* (2013.01); *E05D 3/18* (2013.01)

(58) Field of Classification Search
CPC combination set(s) only.
See application file for complete search history.

(56) References Cited

U.S. PATENT DOCUMENTS

| | | | |
|---|---|---|---|
| 6,577,496 | B1 | 6/2003 | Gioscia et al. |
| 7,334,765 | B2 | 2/2008 | Hwang |
| 10,586,941 | B2 | 3/2020 | Lee et al. |
| 10,845,850 | B1 | 11/2020 | Kang et al. |
| 11,474,563 | B2 | 10/2022 | Hamburgen et al. |
| 2007/0211036 | A1 | 9/2007 | Perkins |

(Continued)

FOREIGN PATENT DOCUMENTS

| | | | |
|---|---|---|---|
| CN | 1612681 | A | 5/2005 |
| CN | 101520070 | A | 9/2009 |

(Continued)

OTHER PUBLICATIONS

Notice of Intent to Grant, and translation thereof, from counterpart Application No. 112137834 dated Oct. 29, 2024, 12 pp.

(Continued)

*Primary Examiner* — Allen L Parker
*Assistant Examiner* — Dakota M Talbert
(74) *Attorney, Agent, or Firm* — Shumaker & Sieffert, P.A.

(57) ABSTRACT

An example folding device includes a hinge assembly that is coplanar with the continuous display of the device in order to decrease the thickness of the device. The hinge assembly includes torque members that increase the amount of force needed to rotate the assemblies. In this way, the torque members may provide the device with a more rigid feel. Also in this way, the torque members may enable the device to hold intermediate positions between fully open and fully closed.

16 Claims, 8 Drawing Sheets

(56) References Cited

U.S. PATENT DOCUMENTS

| | | | |
|---|---|---|---|
| 2009/0217486 | A1 | 9/2009 | Itakura et al. |
| 2010/0066685 | A1 | 3/2010 | Cain et al. |
| 2014/0285433 | A1 | 9/2014 | Park et al. |
| 2015/0266272 | A1 | 9/2015 | Lee et al. |
| 2016/0320809 | A1 * | 11/2016 | Rosen ........................ E05D 3/02 |
| 2017/0359914 | A1 | 12/2017 | Yanagisawa et al. |
| 2017/0364220 | A1 | 12/2017 | Karl et al. |
| 2018/0103132 | A1 | 4/2018 | Prushinskiy et al. |
| 2018/0188910 | A1 | 7/2018 | Ko et al. |
| 2018/0314299 | A1 | 11/2018 | Xia et al. |
| 2020/0233464 | A1 * | 7/2020 | Lee ...................... H04M 1/0268 |
| 2021/0325937 | A1 | 10/2021 | Siddiqui et al. |
| 2021/0373612 | A1 * | 12/2021 | Hwang ................. G06F 1/1616 |
| 2022/0035419 | A1 * | 2/2022 | Park ...................... G06F 1/1679 |

FOREIGN PATENT DOCUMENTS

| | | | |
|---|---|---|---|
| CN | 106960849 | A | 7/2017 |
| CN | 107111152 | A | 8/2017 |
| EP | 2811365 | A1 | 12/2014 |
| JP | 2015105693 | A | 6/2015 |
| JP | 2022531211 | A | 7/2022 |
| KR | 101463387 | B1 | 11/2014 |
| TW | I554689 | B | 10/2016 |
| TW | M612418 | U | 5/2021 |
| WO | 2016075585 | A1 | 5/2016 |
| WO | 2017113393 | A1 | 7/2017 |
| WO | 2021194595 | A | 9/2021 |

OTHER PUBLICATIONS

International Search Report and Written Opinion of International Application No. PCT/US2022/077777 dated May 16, 2023, 11 pp.

First Office Action and Search Report, and translation thereof, from counterpart Application No. 112137834 dated Jun. 24, 2024, 13 pp.

Response to Communication Pursuant to Rules 161(1) and 162 EPC dated Apr. 9, 2025, from counterpart European Application No. 22798412.7, filed Oct. 9, 2025, 19 pp.

Office Action, and translation thereof, from counterpart Japanese Application No. 2025-518981 dated Jun. 16, 2026, 10 pp.

* cited by examiner

FOLDING PORTABLE DISPLAY DEVICE

BACKGROUND

Devices that include displays may be referred to as display devices. In general, it may be desirable to increase a size of a display (e.g., the area on which images are displayed) as much as possible. Increasing the size of a display may make the device that includes the display large and unwieldy. For instance, devices with larger displays may not fit in pockets, bags, and the like. One way to increase the size of a display without unduly increasing the size of the device is to make the device collapsible such that the display can be folded (e.g., in half).

SUMMARY

In general, aspects of this disclosure are directed to folding devices that include foldable continuous displays with a supported span. A folding device may include at least two assemblies (e.g., panels) and a mechanism configured to allow the assemblies to be moved into a collapsed state in which the device is considered closed and an expanded state in which the device is considered open. When the device is in the expanded state, a display may be visible and may cover at least a portion of an inner surface of all of the assemblies. As such, the device may be considered to be a continuous display (i.e., because it continues across a boundary between the assemblies). By utilizing such a folding device, the device may include a display with a relatively large length and/or width (e.g., display area) without overly increasing a length and/or width of the device when in the collapsed state. In this way, the "pocketability" of large-screen portable devices may be improved.

In some examples, a folding device may have a thickness that impairs pocketability of the device. The thickness of the device may be due to the location of the hinge assembly relative to the display of the device. In some examples, depending on the configuration of the hinge assembly, the feeling (e.g., how opening and closing device 100 feels to a user), auto-locking (e.g., holding an intermediate positions between fully open and fully closed), cycling life, open-close force advantages, etc., of a hinge assembly may be improved.

In accordance with one or more aspects of this disclosure, a folding device may include a hinge assembly with torque members that is coplanar with the continuous display in order to decrease the thickness of the device. The torque members of the hinge assembly may increase the amount of force needed to rotate the assemblies. In this way, the torque members may provide the folding device with a more rigid feel. Also in this way, the torque members may enable the folding device to hold intermediate positions between fully open and fully closed (e.g., a half open position where the assemblies are at approximately a 90-degree angle with respect to each other).

In one example, a folding device comprises: a continuous display; a hinge assembly, defining a first hinge axis and a second hinge axis, comprising a barrel; a first hinge arm assembly, rotatably connected to the hinge assembly about the first hinge axis; a second hinge arm assembly, rotatably connected to the hinge assembly about the second hinge axis; a first shaft, defining a first shaft axis, connected to the barrel; a second shaft, defining a second shaft axis, connected to the barrel; a first torque member, mounted on the first shaft, configured to exert a first biasing torque about the first shaft axis; a second torque member, mounted on the second shaft, configured to exert a second biasing torque about the second shaft axis; a first torque arm, mechanically coupled to the first torque member, configured to: rotate about the first shaft axis; and slide relative to the first hinge arm assembly; and a second torque arm, mechanically coupled to the second torque member, configured to: rotate about the second shaft axis; and slide relative to the second hinge arm assembly.

The details of one or more examples are set forth in the accompanying drawings and the description below. Other features, objects, and advantages of the disclosure will be apparent from the description and drawings, and from the claims.

DETAILED DESCRIPTION

Figure 1:
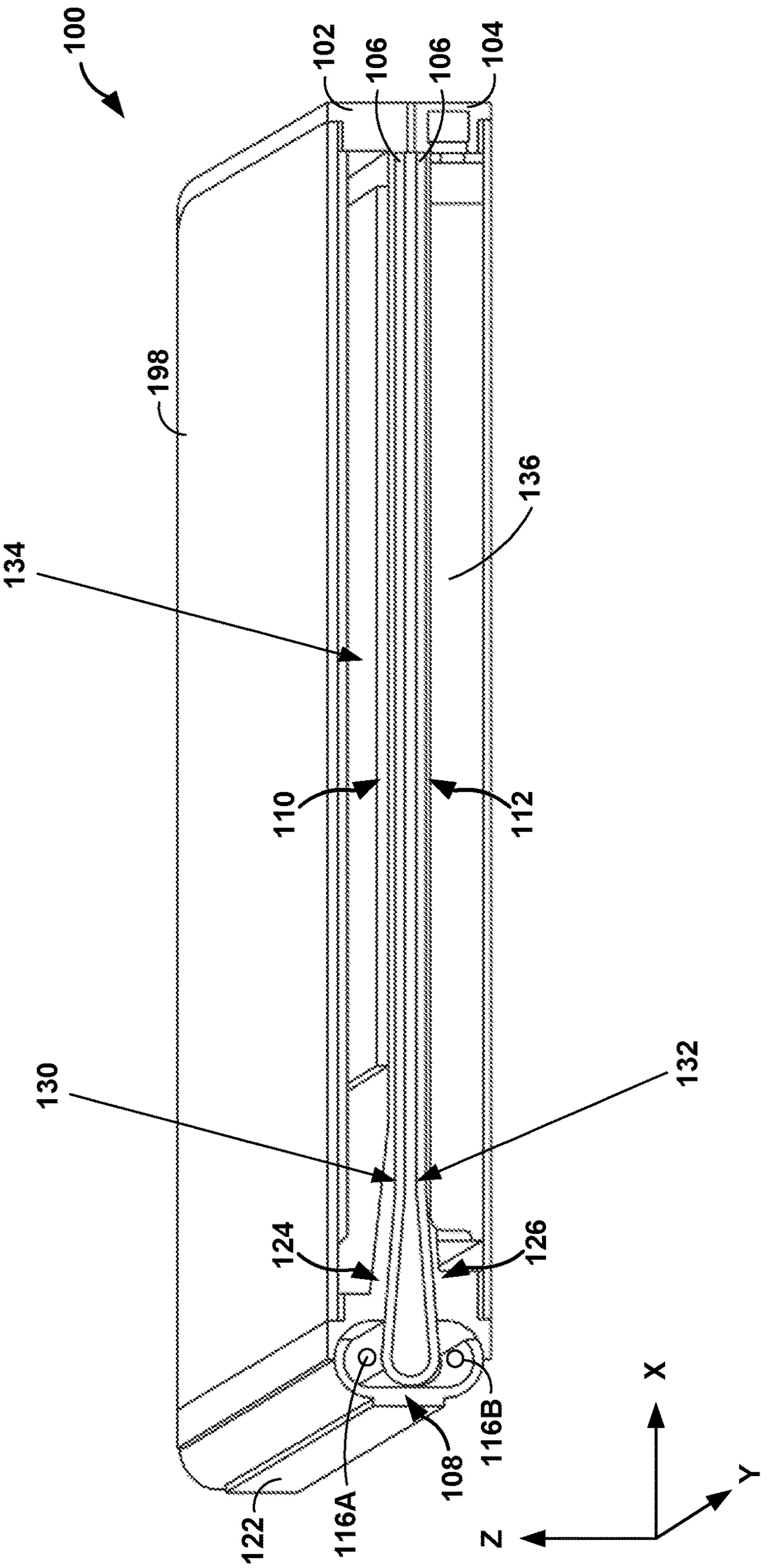
FIG. 1 is a schematic diagram illustrating a cross section of a folding device with a multi-rigid segment flexible display, in accordance with one or more aspects of this disclosure.

FIG. 1 is a schematic diagram illustrating a cross section of a folding device 100 with a multi-rigid segment flexible display, in accordance with one or more aspects of this disclosure. Examples of device 100 include foldable mobile computing devices such as foldable smart phones, foldable tablets, foldable e-readers, foldable gaming systems, or any other foldable portable device that includes a display.

As shown in FIG. 1, device 100 includes first assembly 102, second assembly 104, continuous display 106, and hinge assembly 122. First assembly 102 may be configured to rotate about first hinge axis 116A, which defines a first hinge axis in the y-direction, and second assembly 104 may be configured to rotate about second hinge axis 116B, which defines a second hinge axis in the y-direction. Each of first assembly 102 and second assembly 104 may include an inner surface and an outer surface. The outer surface of first assembly 102 may be visible when looking down at device 100 in the z-axis and the outer surface of second assembly 104 may be visible when looking up at device 100 in the z-axis. The inner surfaces of first assembly 102 and second assembly 104 may not be externally visible when device 100 is closed.

As shown in FIG. 1, first assembly 102 may include main logic board 134 and second assembly 104 may include battery 136. This is merely one example arrangement of components amongst first assembly 102 and/or second assembly 104; other arrangements are possible. For instance, both first assembly 102 and second assembly 104 may include respective batteries.

Continuous display 106 may be capable of rendering data into images viewable by a user of device 100. For example, continuous display 106 may include a matrix of pixels that are individually controllable. Examples of continuous display 106 include, but are not limited to, liquid crystal displays (LCD), light emitting diode (LED) displays, organic light-emitting diode (OLED) displays, micro light-emitting diode (microLED) displays, or similar monochrome or color displays capable of outputting visible information to a user of device 100.

In some examples, device 100 may include one or more displays in addition to continuous display 106. For instance, as shown in FIG. 1, device 100 may include a first additional display on the outer surface of first assembly 102 (e.g., display 198). In some examples, device 100 may further include a second additional display on the outer surface of second assembly 104.

One or more of continuous display 106, the first additional display, and/or the second additional display may be presence-sensitive displays. In some examples, a presence sensitive display may detect an object at and/or near a screen. As one example range, a presence-sensitive display may detect an object, such as a finger or stylus that is within 2 inches or less of the screen. The presence-sensitive display may determine a location (e.g., an (x,y) coordinate) of a screen at which the object was detected. In another example range, a presence-sensitive display may detect an object six inches or less from the screen and other ranges are also possible. The presence-sensitive display may determine the location of the screen selected by a user's finger using capacitive, inductive, and/or optical recognition techniques. In some examples, presence sensitive display also provides output to a user using tactile, audio, or video stimuli.

As shown in the example of FIG. 1, continuous display 106 includes first rigid segment 110 attached to first assembly 102 (e.g., positioned on the inner surface of first assembly 102 and coplanar with the inner surface of first assembly 102), flexible segment 108, and second rigid segment 12 attached to second assembly 104 (e.g., positioned on the inner surface of second assembly 104 and coplanar with the inner surface of first assembly 102). As further shown in the example of FIG. 1, flexible segment 108 includes rigid segment 124 connecting rigid segment 110 to flexible segment 108 and rigid segment 126 connecting rigid segment 112 to flexible segment 108. When device 100 is fully open, rigid segment 124 may be coplanar with the inner surface of first assembly 102 and rigid segment 126 may be coplanar with the inner surface of second assembly 104. However, when device 100 is fully closed, rigid segment 124 may not be coplanar with the inner surface of first assembly 102 and rigid segment 126 may not be coplanar with the inner surface of second assembly 104. Rigid segment 124 may be articulable relative to rigid segment 110 at hinge point 130. Rigid segment 126 may be articulable relative to rigid segment 112 at hinge point 132.

Rigid segments 110 and 112 may be referred to as primary rigid segments while rigid segments 124 and 126 may be referred to as secondary rigid segments. In some examples, a width (e.g., in the x-direction) of the primary rigid segments may be substantially larger than a width of the secondary rigid segments. For instance, a width of rigid segment 124 may be less than or equal to a quarter (25%) of a width of rigid segment 110. Similarly, a width of rigid segment 126 may be less than or equal to a quarter (25%) of a width of rigid segment 112.

The secondary rigid segments may be articulable relative to neighboring primary rigid segments. As one example, rigid segment 124 may be articulable relative to rigid segment 110 at hinge point 130. As another example, rigid segment 126 may be articulable relative to rigid segment 112 at hinge point 132. In some examples, the articulation points between secondary rigid segments and primary rigid segments (e.g., hinge points 130 and 132) may have large radii and limited movement as compared to the radius and movement of primary flexible segment 108. As one example, rigid segment 124 may be configured to articulate at most 45 degrees relative to rigid segment 110. As another example, rigid segment 126 may be configured to articulate at most 45 degrees relative to rigid segment 112.

Primary flexible segment 108 may connect the rigid segments of one side of device 100 to the rigid segments of the other side of device 100. For instance, as shown in FIG. 1, primary flexible segment 108 may connect rigid segment 124 to rigid segment 126. Primary flexible segment 108 may be configured to fold at least 180 degrees (e.g., to facilitate closure of device 100).

Device 100 may include one or more supporting plates (e.g., backer plates) configured to render segments of continuous display 106 flexible or rigid. The supporting plates may be positioned between emissive elements of continuous display 106 (e.g., OLEDs) and the inner surfaces of first assembly 102 and second assembly 104.

In some examples, device 100 may include respective supporting plates for segments of continuous display 106. For instance, the one or more supporting plates may include a first supporting plate attached to first rigid segment 110, a second supporting plate attached to second rigid segment 112, a third supporting plate attached to rigid segment 124, and/or a fourth supporting plate attached to rigid segment 126.

In some examples, the one or more supporting plates may include a respective supporting plate for each of first assembly 102 and second assembly 104 that support segments of continuous display 106 on the respective assembly. For instance, the one or more supporting plates may include a first supporting plate attached to first rigid segment 110 and rigid segment 124 that is configured to permit bending between first rigid segment 110 and rigid segment 124, and a second supporting plate attached to second rigid segment 112 and rigid segment 126 that is configured to permit bending between second rigid segment 112 and rigid segment 126.

In some examples, the one or more supporting plates may include a single supporting plate that is attached to segments of continuous display 106 on both first assembly 102 and second assembly 104. For instance, the one or more supporting plates may include a single supporting plate attached to primary flexible segment 108 and all primary and secondary rigid segments (e.g., first rigid segment 110, second rigid segment 112, rigid segment 124 and rigid segment 126). The single supporting plate may be configured to permit bending between the segments. To permit bending between segments, a supporting plate may be etched and/or perforated at a boundary between adjacent segments.

In some examples, device 100 may have a thickness that impairs pocketability of device 100. For instance, device 100 may have a thickness greater than 10 millimeters (mm) when device 100 is in a collapsed state in which device 100 may be considered closed. The thickness of device 100 may be due to the location of hinge assembly 122 relative to display 106. For example, if hinge assembly 122 is not coplanar with display 106, hinge assembly 122 may significantly increase the thickness of device 100.

In accordance with techniques of this disclosure, hinge assembly 122 may be configured to allow for a thinner folding device while improving one or more of the feeling, auto-locking, cycling life, or open-close force advantages of device 100. For instance, as described in greater detail below, hinge assembly 122 may include torque members that provide device 100 with a more rigid feel, enable device 100 to auto-lock, improve cycling life and open-close force advantages etc. In this way, hinge assembly 122 may provide better or comparable performance (e.g., better feeling, auto-locking, cycling life, open-close force advantages, etc.) in a thinner housing.

Figure 2:
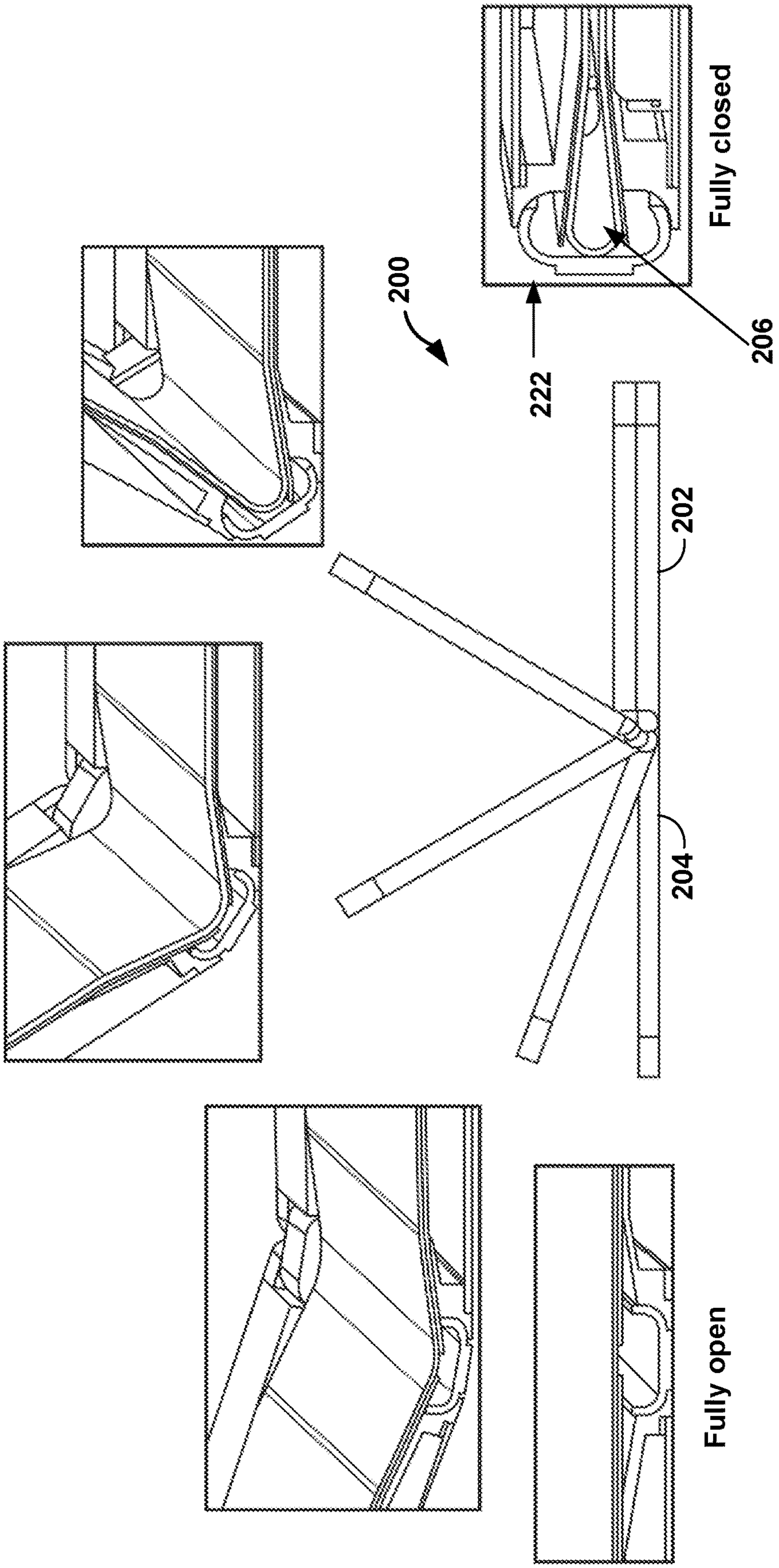
FIG. 2 is a schematic diagram illustrating a folding device with a flexible display in a plurality of folded states, in accordance with one or more aspects of this disclosure.

FIG. 2 is a schematic diagram illustrating a folding device 200 with a flexible continuous display 206 in a plurality of folded states, in accordance with one or more aspects of this disclosure. Device 200 may be an example of device 100 shown in FIG. 1. As shown in FIG. 2, a portion of display 206 resides within a hinge assembly 222 while device 200 is closed. As shown in FIG. 2, when folding device 200 is fully open, an inner surface of a first assembly 202 is coplanar with an inner surface of a second assembly 204.

Torque members of hinge assembly 222 may be configured to exert biasing torques that resist rotation of hinge arm assembly 222. In this way, the torque members may enable device 200 to hold the intermediate positions between fully open and fully closed shown in FIG. 2.

Figure 3:
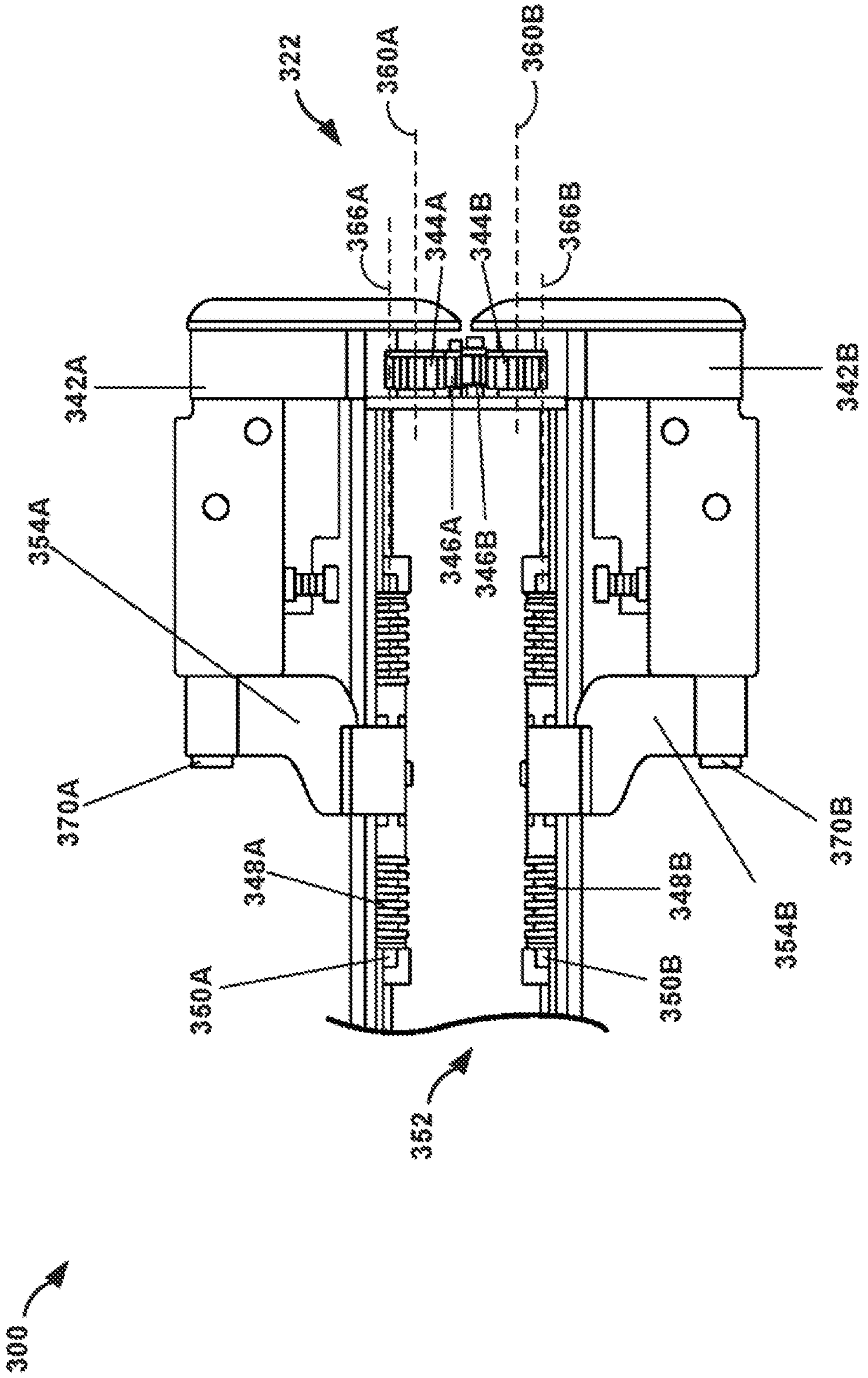
FIG. 3 is a schematic diagram illustrating components of a folding device with a hinge assembly, in accordance with one or more aspects of this disclosure.

FIG. 3 is a schematic diagram illustrating components of a folding device 300 with a hinge assembly 322, in accordance with one or more aspects of this disclosure. Device 300 may be an example of device 100 shown in FIG. 1. As described in greater detail below, the components of device 300 may be configured to allow for a thinner folding device while improving one or more of the feeling, auto-locking, cycling life, or open-close force advantages of device 300.

Hinge assembly 322 may be an example of hinge assembly 122 shown in FIG. 1. A first hinge arm assembly 342A and a second hinge arm assembly 342B (collectively. "hinge arm assemblies 342") may be rotatably connected to hinge assembly 322. For example, first hinge arm assembly 342A may be rotatably connected to hinge assembly 322 about a first hinge axis 360A, and second hinge arm assembly 342B may be rotatably connected to hinge assembly 322 about a second hinge axis 360B.

Hinge assembly 322 may include a first hinge gear 344A and a second hinge gear 344B (collectively, "hinge gears 344"). First hinge gear 344A may be configured to rotate about the first hinge axis, and second hinge gear 344B may be configured to rotate about the second hinge axis. Hinge gears 344 may extend from or otherwise be connected to hinge arm assemblies 342. In the example of FIG. 3, first hinge gear 344A extends from first hinge arm assembly 342A, and second hinge gear 344B extends from second hinge arm assembly 342B.

Hinge assembly 322 may be configured to synchronize movement of hinge arm assemblies 342 as device 300 is moved between the opened state and the closed state. For example, first hinge gear 344A may be configured to mesh with second hinge gear 344B to synchronize movement of first hinge arm assembly 342A and second hinge arm assembly 342B. In another example, hinge assembly 322 may include a first auxiliary gear 346A and a second auxiliary gear 346B (collectively, "auxiliary gears 346"). First auxiliary gear 346A may be configured to mesh with first hinge gear 344A and second auxiliary gear 346B to synchronize movement of first hinge arm assembly 342A and second hinge arm assembly 342B. Second auxiliary gear 346B may be configured to mesh with second hinge gear 344B and first auxiliary gear 346A to synchronize movement of first hinge arm assembly 342A and second hinge arm assembly 342B.

A first torque member 348A and a second torque member 348B (collectively, "torque members 348") may be configured to exert biasing torques that resist rotation of hinge arm assembly 322. In this way, torque members 348 may provide device 300 with a more rigid feel. Also in this way, torque members 348 may enable device 300 to hold intermediate positions between fully open and fully closed (e.g., a half open position where hinge arm assemblies 342, and thus the first and second assembly of device 300, are at approximately a 90-degree angle with respect to each other).

Torque members 348 may be mounted on a first shaft 350A and a second shaft 350B (collectively, "shafts 350"). Shafts 350 may be connected to a barrel 352 of hinge assembly 322. The connection between shafts 350 and barrel 352 may be rotationally fixed. In some examples, first shaft 350A may be welded or otherwise attached to a first sidewall defined by barrel 352, and second shaft 350B may be welded or otherwise attached to a second sidewall defined by barrel 352.

A first torque arm 354A and a second torque arm 354B (collectively, "torque arms 354") may be mechanically coupled to torque members 348. For example, first torque arm 354A may be in contact with first torque member 348A, and second torque arm 354B may be in contact with second torque member 348B. In some examples, torque arms 354 may be connected to cams, which are in turn in contact with torque members 348. The interface between torque members 348 and torque arms 354 may be designed to modify the biasing torques exerted by torque members 348.

First torque arm 354A may be configured to rotate about a first shaft axis 366A defined by first shaft 350A. Rotation of first torque arm 354A (and in turn rotation of first torque member 348A) about first shaft axis 366A may cause first torque member 348A to exert the first biasing torque. Similarly, second torque arm 354B may be configured to rotate about a second shaft axis 366B defined by second shaft 350B. Rotation of second torque arm 354B (and in turn rotation of second torque member 348B) about second shaft axis 366B may cause second torque member 348B to exert the second biasing torque.

Hinge assembly 322 may be configured to synchronize movement of hinge arm assemblies 342 and torque arms 354 as device 300 is moved between the opened state and the closed state. For example, hinge arm assemblies 342 may be mechanically coupled to torque arms 354 such that torque arms 354 (and in turn torque members 348) move when hinge arm assemblies 342 move. In this way, hinge assembly 322 may advantageously modulate or otherwise control the amount of force needed to open and close device 300.

In some examples, the first hinge axis defined by hinge assembly 322 may not be coaxial with the first shaft axis defined by first shaft 350A, and the second hinge axis defined by hinge assembly 322 may not be coaxial with the second shaft axis defined by second shaft 350B. In such examples, and described in greater detail below, torque arms 354 may move relative to hinge arm assemblies 342 to facilitate rotation of hinge arm assemblies 342. In other words, torque arms 354 configured to move relative to hinge arm assemblies 342 may improve rotation of hinge arm assemblies 342 by reducing unwanted resistance arising, e.g., from geometric constraints.

Accordingly, first torque arm 354A may slide or otherwise move relative to first hinge arm assembly 342A, and second torque arm 354B may slide or otherwise move relative to second hinge arm assembly 342B. For example, first hinge arm assembly 342A may define a first channel (e.g., a slot) in which a portion, e.g., a first pin 370A, of first torque arm 354A is disposed, and second hinge arm assembly 342B may define a second channel in which a portion, e.g., a second pin 370B, of second torque arm 354B is disposed. First pin 370A of first torque arm 354A may slide within the first channel, and second pin 370B of second torque arm 354B may slide within the second channel.

When torque arms 354 contact the perimeters of the first channel and the second channel, torque arms 354 and hinge arm assemblies 342 may exert torques on each other. For example, hinge arm assemblies 342 may exert a torque on torque arms 354 to rotate torque arms 354 about the first shaft axis and the second shaft axis, and torque arms 354 may exert the first biasing torque and the second biasing torque to resist rotation of hinge arm assemblies 342 about the first hinge arm axis and the second hinge arm axis.

Figure 4B:
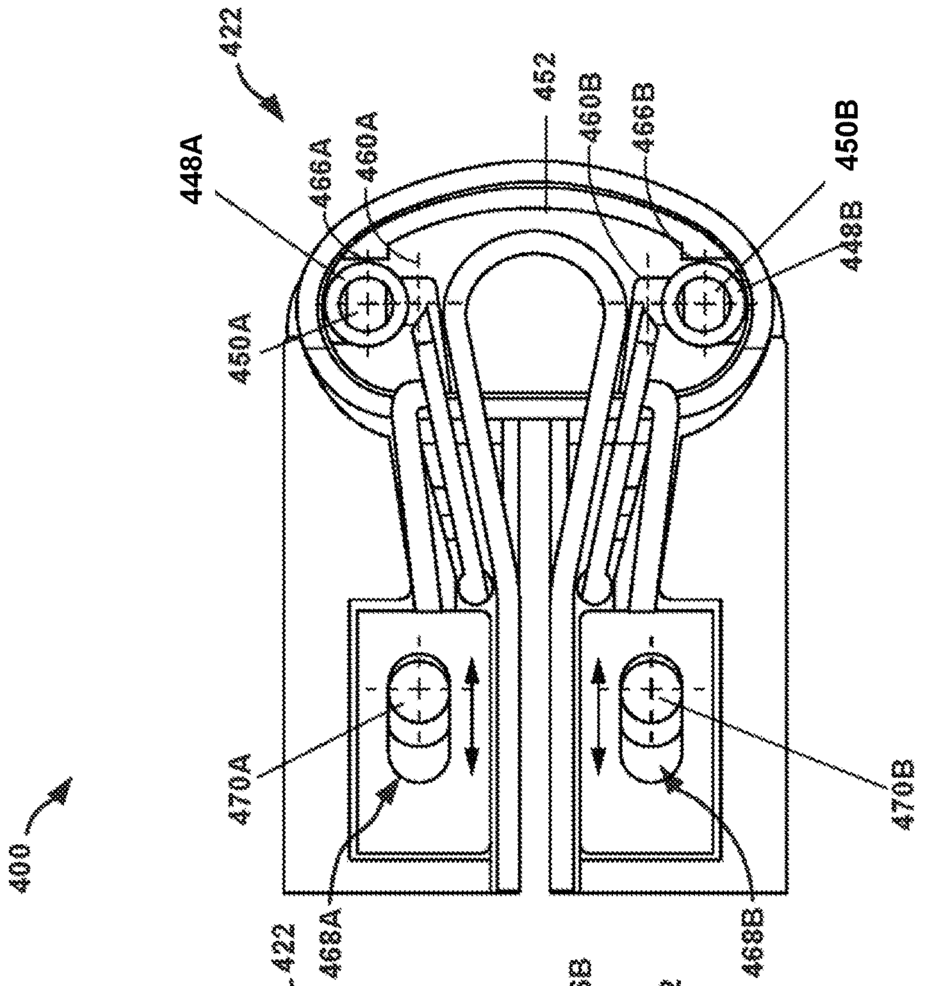
FIGS. 4A and 4B are schematic diagrams illustrating components of a folding device with a hinge assembly, in accordance with one or more aspects of this disclosure.
Figure 4A:
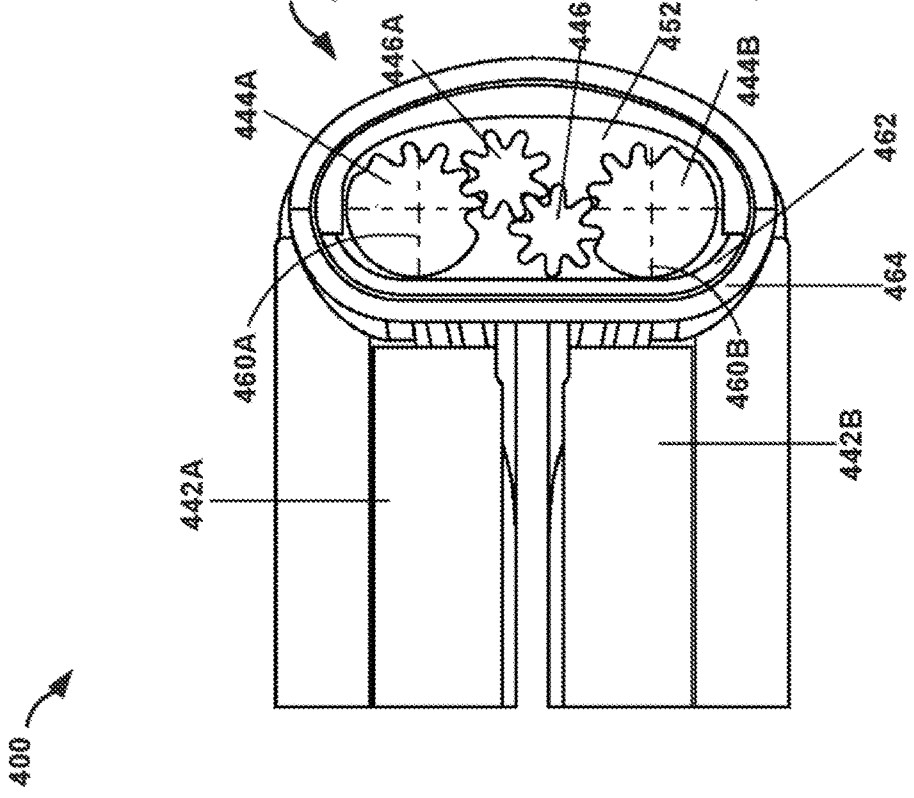

FIGS. 4A-4B are schematic diagrams illustrating components of a folding device 400 with a hinge assembly 422, in accordance with one or more aspects of this disclosure. Hinge assembly 422 may be an example of hinge assembly 122 shown in FIG. 1 and/or hinge assembly 422 shown in FIG. 3.

As shown in FIG. 4A, hinge assembly 422 may include a first hinge gear 444A and a second hinge gear 444B (collectively, "hinge gears 444"). First hinge gear 444A may be configured to rotate about a first hinge axis 460A defined by hinge assembly 422, and second hinge gear 444B may be configured to rotate about a second hinge axis 460B defined by hinge assembly 422.

First hinge gear 444A may be configured to mesh with second hinge gear 444B to synchronize movement of first hinge arm assembly 442A and second hinge arm assembly 442B (collectively, "hinge arm assemblies 442"). In some examples, hinge assembly 422 may include a first auxiliary gear 446A and a second auxiliary gear 446B (collectively, "auxiliary gears 446"). First auxiliary gear 446A may be configured to mesh with first hinge gear 444A and second auxiliary gear 446B to synchronize movement of first hinge arm assembly 442A and second hinge arm assembly 442B. Second auxiliary gear 446B may be configured to mesh with second hinge gear 444B and first auxiliary gear 446A to synchronize movement of first hinge arm assembly 442A and second hinge arm assembly 442B.

Hinge assembly 422 may include a barrel 452. Barrel 452 may at least partially surround hinge gears 444 and auxiliary gears 446. A barrel cap 462 may be configured to mate with barrel 452 such that barrel 452 and barrel cap 462 protect hinge gears 444 and auxiliary gears 446. In some examples, barrel cap 462 may be permanently attached (e.g., welded or glued) to barrel 452. Permanently attaching barrel cap 462 to barrel 452 may provide better axis dimensional control and solid gear box design. For example, by making barrel cap 462 and barrel 452 separate components configured to attach to each other, barrel cap 462 and barrel 452 may be more efficiently and precisely manufactured, which may be particularly important because of the small dimensions of barrel cap 462 and barrel 452. For similar reasons, gear box components (e.g., hinge gears 444, auxiliary gears 446, etc.) may be assembled and aligned more directly to allow for smaller tolerances, potentially producing a better functioning (e.g., smoother) hinge action. A barrel cover 464 may be attached to barrel cap 462 (e.g., via press fit, adhesive, or any other suitable technique).

As shown in FIG. 4B, hinge assembly 422 may include a first shaft 450A and a second shaft 450B (collectively. "shafts 450"). Shafts 450 may be connected to barrel 452. A first torque member 448A and a second torque member 448B may be mounted on first shaft 450A and second shaft 450B, respectively. First shaft 450A may define a first shaft axis 466A, and second shaft 450B may define a second shaft axis 466B. First torque member 448A may be configured to rotate about first shaft axis 466A, in turn causing first torque member 448A to exert a first biasing torque. Similarly, second torque member 448B may be configured to rotate about second shaft axis 466B, in turn causing second torque member 448B to exert a second biasing torque.

In the example of FIG. 4B, first hinge axis 460A is not coaxial with first shaft axis 466A, and second hinge axis 460B is not coaxial with second shaft axis 466B. To allow device 400 to open and close, first hinge arm assembly 442A may define a first channel 468A in which a first pin 470A of first torque arm 454A may be disposed, and second hinge arm assembly 442B may define a second channel 468B in which a second pin 470B of second torque arm 454B may be disposed. First pin 470A may slide within first channel 468A and second pin 470B may slide within second channel 468B such that device 300 is able to open and close.

Figure 5:
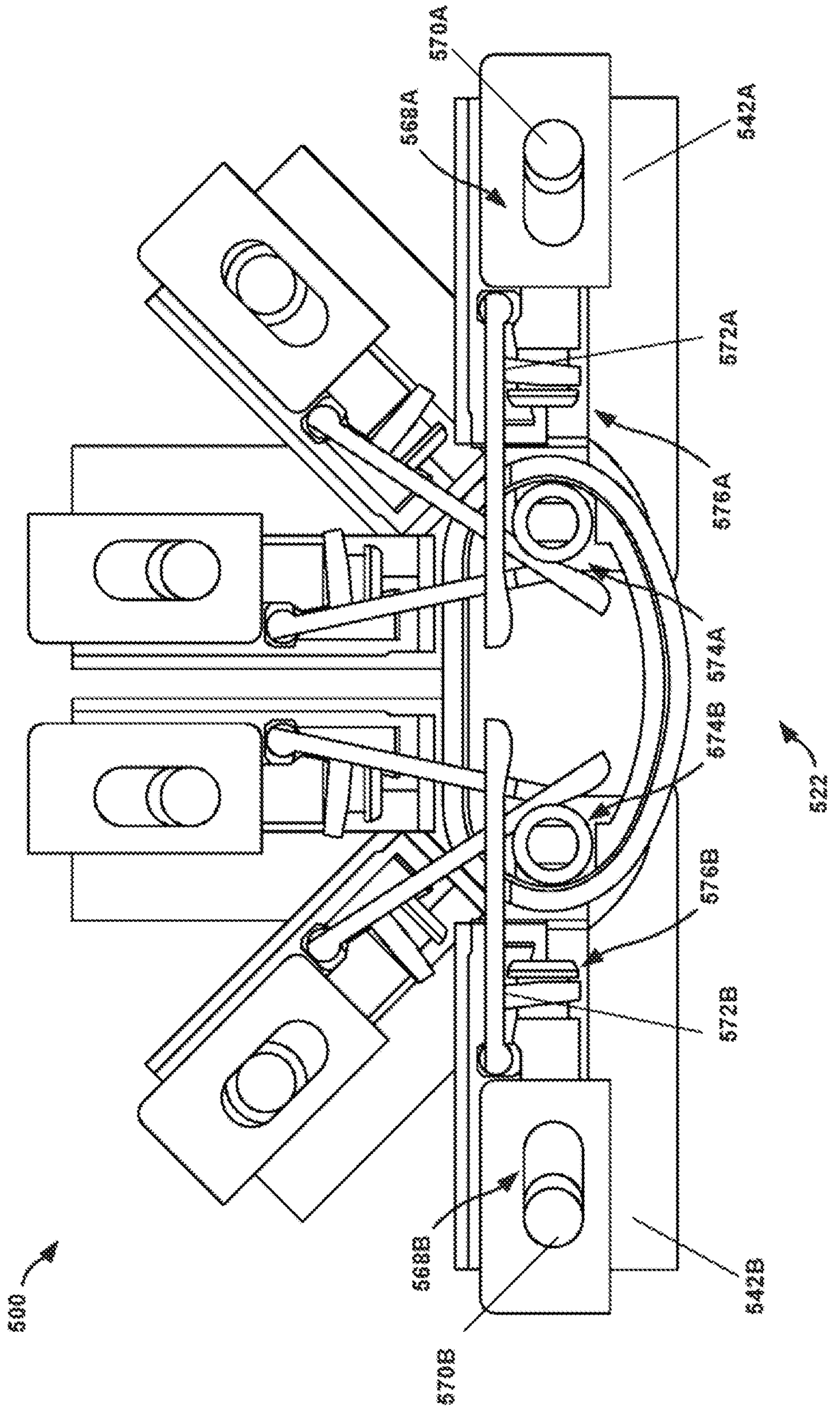
FIG. 5 is a schematic diagram illustrating a folding device having a hinge assembly in a plurality of folded states, in accordance with one or more aspects of this disclosure.

FIG. 5 is a schematic diagram illustrating a folding device 500 having a hinge assembly 522 in a plurality of folded states, in accordance with one or more aspects of this disclosure. Specifically, FIG. 5 illustrates folding device 500 in all three of a fully open state, a fully closed state, and an intermediate (e.g., 45 degree) state. Device 500 may be an example of device 100 shown in FIG. 1, device 200 shown in FIG. 2, device 300 shown in FIG. 3, and/or device 400 shown in FIG. 4. As shown in FIG. 5, a first hinge arm assembly 542A defines a first channel 568A in which a first pin 570A may be disposed, and second hinge arm assembly 542B defines a second channel 568B in which a second pin 570B may be disposed. As shown in FIG. 5, first pin 570A slides within first channel 568A and second pin 570B slides within second channel 568B when device 500 opens and closes due to the geometry of hinge assembly 522 (e.g., the hinge axes and the shaft axes not being coaxial).

Device 500 may include a first supporting plate 572A and a second supporting plate 572B (collectively, "supporting plates 572"). Supporting plates 572 may be configured to be collapsible. For example, contact between supporting plates 572 and edges of hinge assembly 522 may result in deployment of supporting plates 572 as device 500 is opened. For instance, contact between collapsible supporting plates 572 with edges 574A-574B (collectively, "edges 574") of hinge assembly 522 may result in collapsible supporting plates 572 being deployed. While edges 574 of hinge assembly 522 may cause deployment (e.g., raising, lifting, etc.) of collapsible supporting plates 572, it may be desirable for collapsible supporting plates 572 to easily un-deploy (e.g., lower, collapse, etc.) when folding device 500 is closed.

Device 500 may include one or more bias members, such as a first bias member 576A and a second bias member 576B (collectively. "bias members 576"). First bias member 576A may be connected to first supporting plate 572A, and second bias member 576B may be connected to second supporting plate 572B. As shown in FIG. 5, first bias member 576A is configured to facilitate articulation of first supporting plate 572A relative to first hinge arm assembly 542A. As also shown in FIG. 5, second bias member 576B is configured to facilitate articulation of second supporting plate 572B relative to second hinge arm assembly 542B.

In some examples, bias members 576 may be configured to bias supporting plates 572 in a collapsed (e.g., undeployed) position. For instance, device 500 may include first bias member 576A located in first assembly 542A and second bias member 576B located in second assembly 542B. First bias member 576A may be configured to bias first supporting plate 572A in the collapsed position and second bias member 576B may be configured to bias second supporting plate 572B in the collapsed position. In some examples, device 500 may include a single bias member per side (e.g., one bias member in each of first assembly 542A and second assembly 542B). In some examples, device 500 may include multiple bias member per side (e.g., two or more bias members in each of first assembly 542A and second assembly 542B). Examples of first bias member 576A and second bias member 576B include spring loaded pins, hydraulic pistons, and the like.

As noted above, first bias member 576A and second bias member 576B may respectively bias supporting plates 572 in the undeployed position. However, the force imparted on supporting plates 572 by edges 574 may be sufficient to overcome the force imparted on collapsible supporting plates 572 by first bias member 576A and second bias member 576B. However, as device 500 transitions to the closed position, first bias member 576A and second bias member 576B may respectively pull collapsible supporting plates 572 down into the collapsed position.

Figure 6:
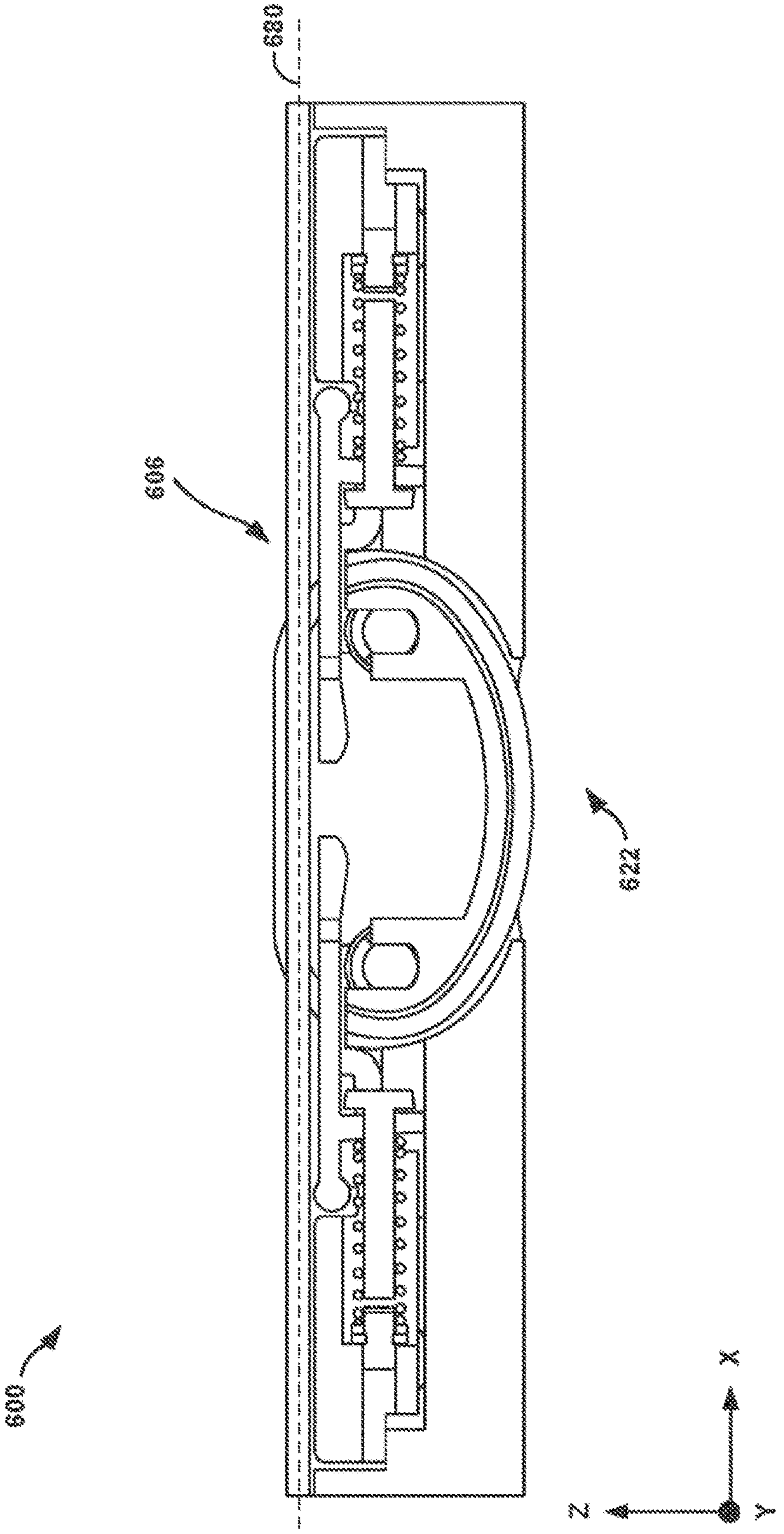
FIG. 6 is a schematic diagram illustrating a folding device with a continuous display and a hinge assembly, in accordance with one or more aspects of this disclosure.

FIG. 6 is a schematic diagram illustrating a folding device 600 with a continuous display 606 and a hinge assembly 622, in accordance with one or more aspects of this disclosure. Device 600 may be an example of device 100 shown in FIG. 1, device 200 shown in FIG. 2, device 300 shown in FIG. 3, device 400 shown in FIG. 4, and/or device 500 shown in FIG. 5.

A hinge assembly 622 according to one or more aspects of this disclosure may be neither under nor above display 606; rather, a cross-section of hinge assembly 622 may be coplanar with a longitudinal cross-section of display 606. In the example of FIG. 6, and as shown by plane 680 (e.g., an x-y plane intersecting display 606), a transverse cross-section of hinge assembly 622 is coplanar with a longitudinal cross-section of display 606 when display 606 is fully opened. Because hinge assembly 622 is neither under nor above display 606 (e.g., with respect to plane 680) but instead coplanar, the form factor of device 600 may be thinner, improving pocketability of device 600.

Figure 7:
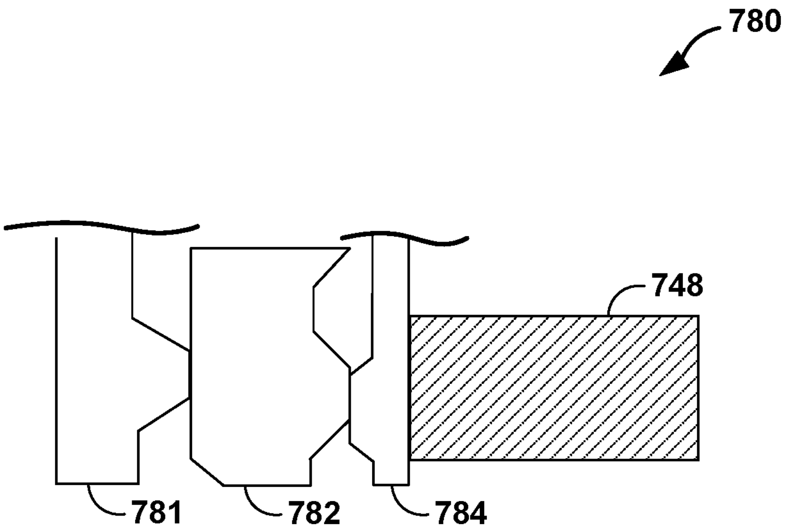
FIG. 7 is a schematic diagram illustrating a cam assembly in accordance with one or more aspects of this disclosure.

FIG. 7 is a schematic diagram of a cam assembly 780 in accordance with one or more aspects of this disclosure. As shown in FIG. 7, cam assembly 780 may include cams mechanically coupled to a torque member 748. For example, cam assembly 780 may include a fixed cam 781, a rotation cam 782, and a slide cam 784. A torque arm (e.g., first torque arm 354A) may be coupled to rotation cam 782 such that rotation of the torque arm causes a corresponding rotation of rotation cam 782.

The components of cam assembly 780 may operate together to exert a biasing torque in accordance with techniques of this disclosure. For example, a biasing force exerted by torque member 748 may press slide cam 784 into rotation cam 782. When rotation cam 782 and slide cam 784 are thus engaged, the friction (e.g., in response to rotation of rotation cam 782) between fixed rotation cam 782 and slide cam 784 may create a torque.

As shown in FIG. 7, rotation cam 782 and slide cam 784 may each have a profile such that rotation cam 782 and slide cam 784 may contact each other at various angles. The angle at which rotation cam 782 and slide cam 784 contact each other may affect the torque created by the friction between fixed rotation cam 782 and slide cam 784. Thus, modifying the profile of rotation cam 782 and/or slide cam 784 may change the torque generated by cam assembly 780. In some examples, the profile of rotation cam 782 and/or slide cam 784 may allow for a torque that varies with rotation of rotation cam 782 relative to slide cam 784.

When rotation cam 782 rotates relative to slide cam 784, torque member 748 may press slide cam 784 into a detent (e.g., a catch, such as a recess, that prevents motion until released) of rotation cam 782. Similarly (and simultaneously), rotation cam 782 may be pressed into a detent of fixed cam 781. When slide cam 784 is positioned in a detent of rotation cam 782 and rotation cam 782 is positioned in a detent of fixed cam 781, fixed cam 781, rotation cam 782, and slide cam 784 may be in a relatively secure configuration that feels "locked." Depending on the angular position of rotation cam 782, fixed cam 781, rotation cam 782, and slide cam 784 may be in this "locked" configuration when cam assembly 780 is open or closed, creating a feeling of "auto-open" and "auto-close" (e.g., because torque member 748 exerts a biasing force that automatically presses fixed cam 781, rotation cam 782, and slide cam 784 into the respective detents when rotation cam 782 is being rotated).

Figure 8:
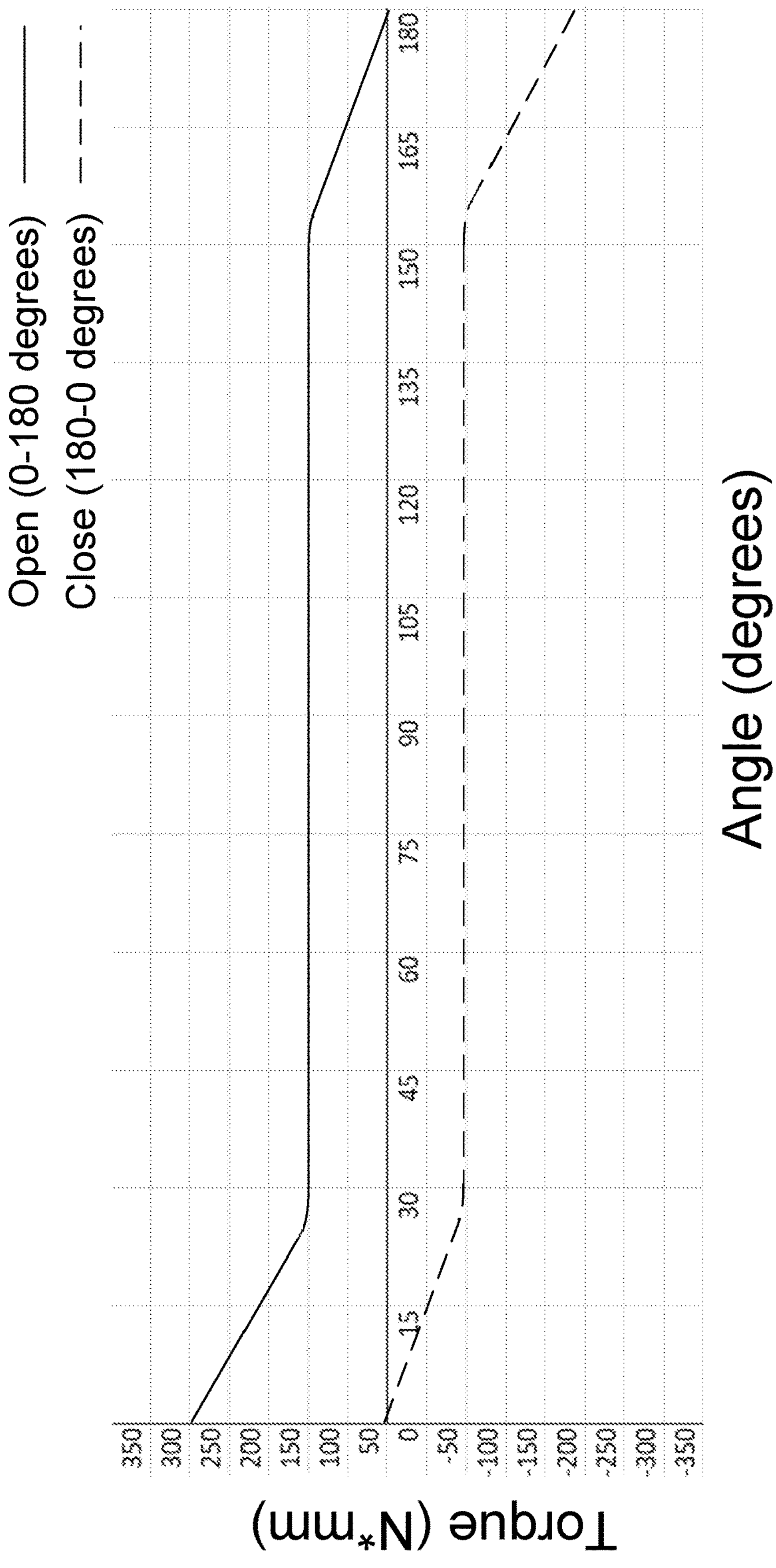
FIG. 8 is a graph illustrating the torque exerted by a hinge assembly in accordance with one or more aspects of this disclosure.

FIG. 8 is a graph illustrating the torque exerted by a hinge assembly in accordance with one or more aspects of this disclosure. FIG. 8 is primarily described with respect to hinge assembly 122 shown in FIG. 1. However, it should be understood that the description of FIG. 8 may apply equally to any other hinge assembly described herein.

The biasing torque exerted by hinge assembly 122 may vary based on the angular position of hinge assembly 122 as well as the direction hinge assembly 122 is being rotated. For example, as shown in FIG. 8, hinge assembly 122 may exert a biasing torque of about 250 Newton-millimeters (N*mm) when hinge assembly 122 is at an angular position of 0 degrees (e.g., when device 100 is completely closed) and being opened (e.g., such that the angular position of hinge assembly 122 is changing from 0 degrees towards 180 degrees). The biasing torque exerted by hinge assembly 122 may decrease from about 250 N*mm to about 100 N*mm as hinge assembly 122 is opened from an angular position of about 0 degrees to about 30 degrees. The biasing torque exerted by hinge assembly 122 may be about 100 N*mm as hinge assembly 122 is opened from about 30 degrees to 150 degrees. The biasing torque exerted by hinge assembly 122 may decrease from about 100 N*mm to about 0 N*mm as hinge assembly 122 is opened to an angular position of about 180 degrees.

In another example, and as shown in FIG. 8, hinge assembly 122 may exert a biasing torque of about −250 N*mm when hinge assembly 122 is at an angular position of 180 degrees (e.g., when device 100 is completely closed) and being closed (e.g., such that the angular position of hinge assembly 122 is changing from 180 degrees towards 0 degrees). The biasing torque exerted by hinge assembly 122 may increase from about −250 N*mm to about −100 N*mm as hinge assembly 122 is closed from an angular position of about 180 degrees to about 150 degrees. The biasing torque exerted by hinge assembly 122 may be about −100 N*mm as hinge assembly 122 is closed from about 150 degrees to 30 degrees. The biasing torque exerted by hinge assembly 122 may increase from about −100 N*mm to about 0 N*mm as hinge assembly 122 is closed to an angular position of about 0 degrees.

The following numbered example may illustrate one or more aspects of this disclosure:

Example 1: A folding device includes a continuous display; a hinge assembly, defining a first hinge axis and a second hinge axis includes rotate about the first shaft axis; and slide relative to the first hinge arm assembly; and a second torque arm, mechanically coupled to the second torque member, configured to: rotate about the second shaft axis; and slide relative to the second hinge arm assembly.

Example 2: The folding device of example 1, wherein a transverse cross-section of the hinge assembly is coplanar with a longitudinal cross-section of the continuous display when the continuous display is fully opened.

Example 3: The folding device of example 1 or 2, further includes a first supporting plate connected to the first hinge arm assembly: a first bias member, connected to the first supporting plate, configured to facilitate articulation of the first supporting plate relative to the first hinge assembly; a second supporting plate connected to the second hinge arm assembly; and a second bias member, connected to the second supporting plate, configured to facilitate articulation of the second supporting plate relative to the second hinge assembly.

Example 4: The folding device of example 3, wherein the first bias member includes a first spring loaded pin, and wherein the second bias member includes a second spring loaded pin.

Example 5: The folding device of any of examples 1 to 4, wherein the hinge assembly includes: a first hinge gear configured to rotate about the first hinge axis, and a second hinge gear configured to rotate about the second hinge axis, wherein the first gear is configured to mesh with the second gear to synchronize movement of the first hinge arm assembly and the second hinge arm assembly.

Example 6: The folding device of example 5, wherein the hinge assembly includes: a first auxiliary gear; and a second auxiliary gear, wherein the first auxiliary gear is configured to mesh with the first hinge gear and the second auxiliary gear to synchronize movement of the first hinge arm assembly and the second hinge arm assembly, and wherein the second auxiliary gear is configured to mesh with the second hinge gear and the first auxiliary gear to synchronize movement of the first hinge arm assembly and the second hinge arm assembly.

Example 7: The folding device of any of examples 1 to 6, wherein the first torque member includes a first spring, and wherein the second torque member includes a second spring.

Example 8: The folding device of any of examples 1 to 7, wherein the first shaft is permanently attached to a first sidewall defined by the barrel, and wherein the second shaft is permanently attached to a second sidewall defined by the barrel.

Example 9: The folding device of any of examples 1 to 8, wherein the hinge assembly includes a barrel cap that is permanently attached to the barrel.

Example 10: The folding device of any of examples 1 to 9, wherein the continuous display includes an organic light-emitting diode (OLED) display or a micro light emitting diode display.

Various aspects have been described in this disclosure. These and other aspects are within the scope of the following claims.

The invention claimed is:

1. A folding device comprising:

a continuous display;

a hinge assembly, defining a first hinge axis and a second hinge axis, comprising a barrel;

a first hinge arm assembly, rotatably connected to the hinge assembly about the first hinge axis;

a second hinge arm assembly, rotatably connected to the hinge assembly about the second hinge axis;

a first shaft, defining a first shaft axis, connected to the barrel;

a second shaft, defining a second shaft axis, connected to the barrel;

a first spring, mounted about the first shaft, configured to exert a first biasing torque about the first shaft axis;

a second spring, mounted about the second shaft, configured to exert a second biasing torque about the second shaft axis;

a first torque arm, mechanically coupled to the first spring, configured to:

rotate about the first shaft axis; and slide relative to the first hinge arm assembly; and a second torque arm, mechanically coupled to the second spring, configured to:

rotate about the second shaft axis; and slide relative to the second hinge arm assembly.

2. The folding device of claim 1, wherein a transverse cross-section of the hinge assembly is coplanar with a longitudinal cross-section of the continuous display when the continuous display is fully opened.

3. The folding device of claim 1, further comprising:

a first supporting plate connected to the first hinge arm assembly;

a first bias member, connected to the first supporting plate, configured to facilitate articulation of the first supporting plate relative to the first hinge assembly;

a second supporting plate connected to the second hinge arm assembly; and a second bias member, connected to the second supporting plate, configured to facilitate articulation of the second supporting plate relative to the second hinge assembly.

4. The folding device of claim 3, wherein the first bias member comprises a first spring loaded pin, and wherein the second bias member comprises a second spring loaded pin.

5. The folding device of claim 1, wherein the hinge assembly comprises:

a first hinge gear configured to rotate about the first hinge axis; and a second hinge gear configured to rotate about the second hinge axis, wherein the first gear is configured to mesh with the second gear to synchronize movement of the first hinge arm assembly and the second hinge arm assembly.

6. The folding device of claim 5, wherein the hinge assembly comprises:

a first auxiliary gear; and a second auxiliary gear, wherein the first auxiliary gear is configured to mesh with the first hinge gear and the second auxiliary gear to synchronize movement of the first hinge arm assembly and the second hinge arm assembly, and wherein the second auxiliary gear is configured to mesh with the second hinge gear and the first auxiliary gear to synchronize movement of the first hinge arm assembly and the second hinge arm assembly.

7. The folding device of claim 1, wherein the first shaft is permanently attached to a first sidewall defined by the barrel, and wherein the second shaft is permanently attached to a second sidewall defined by the barrel.

8. The folding device of claim 1, wherein the hinge assembly comprises a barrel cap that is permanently attached to the barrel.

9. The folding device of claim 1, wherein the continuous display comprises an organic light-emitting diode (OLED) display or a micro light emitting diode display.

10. The folding device of claim 1, wherein the first biasing torque exerted by the first spring and the second biasing torque exerted by the second spring modulate an amount of force needed to open and close the folding device.

11. The folding device of claim 1, further comprising:

a third spring mounted about the first shaft and configured to exert a third biasing torque about the first shaft axis; and a fourth spring mounted about the second shaft and configured to exert a fourth biasing torque about the second shaft axis.

12. The folding device of claim 11, wherein the first biasing torque and the third biasing torque are exerted via the first torque arm, and wherein the second biasing torque and the fourth biasing torque are exerted via the second torque arm.

13. A folding device comprising:

a first assembly;

a second assembly;

a continuous display spanning the first assembly and the second assembly;

a hinge assembly, defining a first hinge axis and a second hinge axis, comprising a barrel;

a first hinge arm assembly connected to the first assembly and rotatably connected to the hinge assembly about the first hinge axis;

a second hinge arm assembly connected to the second assembly and rotatably connected to the hinge assembly about the second hinge axis;

a first shaft, defining a first shaft axis, connected to the barrel;

a second shaft, defining a second shaft axis, connected to the barrel;

a first spring, mounted about the first shaft, configured to exert a first biasing torque about the first shaft axis;

a second spring, mounted about the second shaft, configured to exert a second biasing torque about the second shaft axis;

a first torque arm, mechanically coupled to the first spring, configured to rotate about the first shaft axis and transmit the first biasing torque to the first assembly; and a second torque arm, mechanically coupled to the second spring, configured to rotate about the second shaft axis and transmit the second biasing torque to the second assembly.

14. The folding device of claim 13, wherein the first biasing torque exerted by the first spring and the second biasing torque exerted by the second spring modulate an amount of force needed to open and close the folding device.

15. The folding device of claim 14, further comprising:

a third spring mounted about the first shaft and configured to exert a third biasing torque about the first shaft axis; and a fourth spring mounted about the second shaft and configured to exert a fourth biasing torque about the second shaft axis.

16. The folding device of claim 15, wherein the first torque arm further transmits the third torque to the first assembly, and wherein the second torque arm further transmits the fourth torque to the second assembly.

* * * * *